United States Patent
Wang et al.

(10) Patent No.: US 12,407,311 B2
(45) Date of Patent: Sep. 2, 2025

(54) READOUT CIRCUIT FOR HIGH-PRECISION VIBRATION SENSOR

(71) Applicant: Wenzhou University, Zhejiang (CN)

(72) Inventors: Pengjun Wang, Zhejiang (CN);
Xiangyu Li, Zhejiang (CN); Hao Ye, Zhejiang (CN); Gang Li, Zhejiang (CN)

(73) Assignee: Wenzhou University, Zhejiang (CN)

( * ) Notice: Subject to any disclaimer, the term of this patent is extended or adjusted under 35 U.S.C. 154(b) by 383 days.

(21) Appl. No.: 18/319,411

(22) Filed: May 17, 2023

(65) Prior Publication Data
US 2024/0186969 A1 Jun. 6, 2024

(30) Foreign Application Priority Data
Dec. 6, 2022 (CN) .......................... 202211553264.0

(51) Int. Cl.
| | |
|---|---|
| H03F 3/45 | (2006.01) |
| G01P 15/125 | (2006.01) |
| G01P 21/00 | (2006.01) |
| H03M 3/00 | (2006.01) |

(52) U.S. Cl.
CPC ........ H03F 3/45475 (2013.01); G01P 15/125 (2013.01); G01P 21/00 (2013.01); H03M 3/30 (2013.01)

(58) Field of Classification Search
CPC .................................................. H03F 3/45475
USPC ......................................................... 73/1.38
See application file for complete search history.

(56) References Cited

U.S. PATENT DOCUMENTS 6,497,146 B1 * 12/2002 Hobbs ............... G01C 19/5607
73/1.38
2018/0011125 A1 * 1/2018 Oshima ................. G01P 15/125

FOREIGN PATENT DOCUMENTS

JP 2004328606 A * 11/2004

OTHER PUBLICATIONS

Nakamaru et al. Machine translation of JP2004328606A. Published Nov. 2004. Accessed Jul. 2025. (Year: 2004).*

* cited by examiner

*Primary Examiner* — Walter L Lindsay, Jr.
*Assistant Examiner* — Philip T Fadul
(74) *Attorney, Agent, or Firm* — JCIPRNET

(57) ABSTRACT

A readout circuit for a high-precision vibration sensor comprises an on-chip self-test circuit, a low-noise charge amplifier, a correlated double sampling circuit, a PID feedback control circuit, a phase compensation circuit and Sigma-Delta. A self-test signal is amplified by the low-noise charge amplifier, low-frequency noise and offsets are filtered out by the correlated double sampling circuit, then a self-test path and a working path of a vibration sensor are separated in the time domain by the PID feedback control circuit, the phase compensation circuit performs zero compensation and pole compensation on the signal, and Sigma-Delta converts an analog signal into a high-precision digital signal.

1 Claim, 3 Drawing Sheets

READOUT CIRCUIT FOR HIGH-PRECISION VIBRATION SENSOR

CROSS-REFERENCE TO RELATED APPLICATION

This application claims the priority benefit of China application serial no. 202211553264.0, filed on Dec. 6, 2022. The entirety of the above-mentioned patent application is hereby incorporated by reference herein and made a part of this specification.

BACKGROUND OF THE INVENTION

1. Technical Field

The invention relates to a readout circuit, in particular to a readout circuit for a high-precision vibration sensor.

2. Description of Related Art

Capacitive acceleration sensors based on the MEME process have the advantages of being small in size, low in weight and cost, compatible with the CMOS integrated circuit process, can realize high integration of accelerator sensors, and are important capacitive accelerometers. Capacitive accelerometers, as inertial sensors, are widely used in the military and civil field. In the military field, the capacitive accelerometers, as the key element of a micro inertial measurement unit (MIMU), are greatly demanded by small satellite inertial measurement and control systems, telemetering vehicles, tactical missiles, micro aerial vehicles, miniature spatial kinetic energy weapons and satellite rocket control. The capacitive accelerometers play an important role in the military equipment field and the aerospace field.

Existing capacitive accelerometers typically comprise a capacitive acceleration sensor and an interface circuit, wherein the capacitive acceleration sensor determines the acceleration by sensing the vibration amplitude and is also called a vibration sensor, and the interface circuit is used for post-processing of acceleration data output by the vibration sensor and is also called a readout circuit. The reliability of the capacitive accelerometers is the key point of design, so self-test is an important function of the capacitive accelerometers. A self-test module is disposed in the capacitive accelerometers to realize the self-test function. The self-test module is independent of the vibration sensor and the readout circuit, thus occupying a large area of the capacitive accelerometers. In addition, the self-test module is connected in parallel to the vibration sensor, so when the vibration sensor works, the self-test module is equivalent to a capacitor connected in parallel with the vibration sensor, and in this case, the parasitic capacitance generated by the self-test module will leak and be coupled to the output terminal of the capacitive accelerometers together with charges of the vibration sensor, thus compromising the precision of the capacitive accelerometers and leading to low output precision of the capacitive accelerometers. In order to improve the output precision of the capacitive accelerometers, a high-order high-pass filter is often cascaded to the output terminal of the capacitive accelerometers, which not only increases the use cost of the capacitive accelerometers, but also results in demodulation output errors caused by parameter changes of the high-order high-pass filter, and the improvement of the output precision is limited.

BRIEF SUMMARY OF THE INVENTION

The technical issue to be settled by the invention is to provide a readout circuit for a high-precision vibration sensor. The readout circuit has a self-test function and can realize self-test of capacitive accelerometers, thus avoiding an independent self-test module which occupies a large area of the capacitive accelerometers; self-test signals will not leak or be coupled to the output terminal of the capacitive accelerometers together with charges of the vibration sensor, and will not compromise the output precision of the capacitive accelerometers, so the output precision of the capacitive accelerometers is high; and a high-order high-pass filter does not need to be cascaded to the output terminal of the capacitive accelerometers, so the use cost will not be increased.

The technical solution adopted by the invention to settle the above technical issue is as follows: a readout circuit for a high-precision vibration sensor comprises an on-chip self-test circuit, a low-noise charge amplifier, a correlated double sampling circuit, a PID feedback control circuit, a phase compensation circuit and Sigma-Delta;

The on-chip self-test circuit comprises a thirteenth switch, a fourteenth switch, a fifteenth switch, a sixteenth switch, a twenty-first capacitor and a twenty-second capacitor, wherein one terminal of the thirteenth switch is a first input terminal of the on-chip self-test circuit, the other terminal of the thirteenth switch, one terminal of the fifteenth switch and one terminal of the twenty-first capacitor are connected, the other terminal of the fifteenth switch is grounded, the other terminal of the twenty-first capacitor is a first output terminal of the on-chip self-test circuit, one terminal of the fourteenth switch is a second input terminal of the on-chip self-test circuit, the other terminal of the fourteenth switch, one terminal of the sixteenth switch and one terminal of the twenty-second capacitor are connected, the other terminal of the sixteenth switch is connected to a positive pole of a power supply, and the other terminal of the twenty-second capacitor is a second output terminal of the on-chip self-test circuit;

The low-noise charge amplifier comprises a fifth capacitor, a sixth capacitor, a first operational amplifier, a fifth switch, a sixth switch, a ninth switch and a tenth switch, wherein the first operational amplifier has a positive input terminal, a negative input terminal, a positive output terminal and a negative output terminal, one terminal of the fifth switch is a first input terminal of the low-noise charge amplifier, the other terminal of the fifth switch, one terminal of the sixth switch, one terminal of the fifth capacitor and the negative input terminal of the first operational amplifier are connected, the other terminal of the sixth switch, the other terminal of the fifth capacitor and the positive output terminal of the first operational amplifier are connected and a connecting terminal is a first output terminal of the low-noise charge amplifier, one terminal of the ninth switch is a second input terminal of the low-noise charge amplifier, the other terminal of the ninth switch, one terminal of the tenth switch, one terminal of the sixth capacitor and the positive input terminal of the first operational amplifier are connected, and the other terminal of the tenth switch, the other terminal of the sixth capacitor and the negative output terminal of the first operational amplifier are connected and a connecting terminal is a second output terminal of the low-noise charge amplifier;

The correlated double sampling circuit comprises a seventh capacitor, an eighth capacitor, a ninth capacitor, a tenth capacitor, a second operational amplifier, a third operational amplifier, an eighth switch, an eleventh switch, a thirty-third switch and a thirty-forth switch, wherein the second operational amplifier and the third operational amplifier each have a positive input terminal, a negative input terminal and an output terminal, one terminal of the seventh capacitor is a first input terminal of the correlated double sampling circuit, the other terminal of the seventh capacitor, one terminal of the eighth switch and one terminal of the thirty-third switch are connected, the other terminal of the thirty-third switch, one terminal of the ninth capacitor and the positive input terminal of the second operational amplifier are connected, the other terminal of the eighth switch and the other terminal of the ninth capacitor are both connected to the positive pole of the power supply, the negative input terminal of the second operational amplifier and the output terminal of the second operational amplifier are connected and a connecting terminal is a first output terminal of the correlated double sampling circuit, one terminal of the eighth capacitor is a second input terminal of the correlated double sampling circuit, the other terminal of the eighth capacitor, one terminal of the eleventh switch and one terminal of the thirty-fourth switch are connected, the other terminal of the thirty-fourth switch, one terminal of the tenth capacitor and the positive input terminal of the second operational amplifier are connected, the other terminal of the eleventh switch and the other terminal of the tenth capacitor are both connected to the positive pole of the power supply, and the negative input terminal of the third operational amplifier and the output terminal of the third operational amplifier are connected and a connecting terminal is a second output terminal of the correlated double sampling circuit;

The PID feedback control circuit comprises a seventh switch, a twelfth switch, a first resistor, a second resistor, a third resistor, a fourth resistor, a fifth resistor, a sixth resistor, an eleventh capacitor, a twelfth capacitor, a thirteenth capacitor, a fourteenth capacitor and a fourth operational amplifier, wherein the fourth operational amplifier has a positive input terminal, a negative input terminal, a positive output terminal and a negative output terminal, one terminal of the seventh switch is a first output terminal of the PID feedback control circuit, the other terminal of the seventh switch, one terminal of the thirteenth capacitor and the positive output terminal of the fourth operational amplifier are connected, the other terminal of the thirteenth capacitor is connected to one terminal of the third resistor, the other terminal of the third resistor, one terminal of the eleventh capacitor, one terminal of the first resistor and the positive input terminal of the fourth operational amplifier are connected, the other terminal of the eleventh capacitor is connected to one terminal of the second resistor, the other terminal of the second resistor and the other terminal of the first resistor are connected and a connecting terminal is a first input terminal of the PID feedback control circuit, one terminal of the twelfth switch is a second output terminal of the PID feedback control circuit, the other terminal of the twelfth switch, one terminal of the fourteenth capacitor and the negative output terminal of the fourth operational amplifier are connected, the other terminal of the fourteenth capacitor is connected to one terminal of the sixth resistor, the other terminal of the sixth resistor, one terminal of the twelfth capacitor, one terminal of the fourth resistor and the negative input terminal of the fourth operational amplifier are connected, the other terminal of the twelfth capacitor is connected to one terminal of the fifth resistor, the other terminal of the fifth resistor and the other terminal of the fourth resistor are connected and a connecting terminal is a second input terminal of the PID feedback control circuit;

The phase compensation circuit comprises a seventeenth switch, an eighteenth switch, a nineteenth switch, a twentieth switch, a twenty-first switch, a twenty-second switch, a twenty-third switch, a twenty-fourth switch, a twenty-fifth switch, a twenty-sixth switch, a twenty-seventh switch, a twenty-eighth switch, a twenty-ninth switch, a thirtieth switch, a thirty-first switch, a thirty-second switch, a fifteenth capacitor, a sixteenth capacitor, a seventeenth capacitor, an eighteenth capacitor, a nineteenth capacitor, a twentieth capacitor, a fifth operational amplifier and a sixth operational amplifier, wherein the fifth operational amplifier and the sixth operational amplifier each have a positive input terminal, a negative input terminal and an output terminal, one terminal of the seventeenth switch is a first input terminal of the phase compensation circuit, the other terminal of the seventeenth switch, one terminal of the eighteenth switch, one terminal of the fifteenth capacitor and one terminal of the sixteenth capacitor are connected, the other terminal of the eighteenth switch is grounded, the other terminal of the fifteenth capacitor, one terminal of the nineteenth switch and one terminal of the twentieth switch are connected, the other terminal of the twentieth switch is grounded, the other terminal of the sixteenth capacitor, one terminal of the twenty-first switch and one terminal of the twenty-second switch are connected, the other terminal of the twenty-first switch is grounded, the other terminal of the nineteenth switch, the other terminal of the twenty-second switch, one terminal of the twenty-third switch, one terminal of the seventeenth capacitor and the negative input terminal of the fifth operational amplifier are connected, the positive input terminal of the fifth operational amplifier is grounded, the other terminal of the twenty-third switch, the other terminal of the seventeenth capacitor, one terminal of the twenty-fourth switch and the output terminal of the fifth operational amplifier are connected, the other terminal of the twenty-fourth switch is a first output terminal of the phase compensation circuit, one terminal of the twenty-fifth switch is a second input terminal of the phase compensation circuit, the other terminal of the twenty-fifth switch, one terminal of the twenty-sixth switch, one terminal of the nineteenth capacitor and one terminal of the twentieth capacitor are connected, the other terminal of the twenty-sixth switch is grounded, the other terminal of the nineteenth capacitor, one terminal of the twenty-seventh switch and one terminal of the twenty-eighth switch are connected, the other terminal of the twenty-eighth switch is grounded, the other terminal of the twentieth capacitor, one terminal of the thirtieth switch and one terminal of the twenty-ninth switch are connected, the other terminal of the thirtieth switch is grounded, the other terminal of the twenty-seventh switch, the other end of the twenty-ninth switch, one terminal of the thirty-first switch, one terminal of the eighteenth capacitor and the negative input terminal of the sixth operational amplifier are connected, the positive input terminal of the sixth operational amplifier is grounded, the other terminal of the thirty-first switch, the other terminal of the eighteenth capacitor, one terminal of the thirty-second switch and the output terminal of the sixth operational amplifier are connected, and the other terminal of the thirty-second switch is a second output terminal of the phase compensation circuit;

The first input terminal of the on-chip self-test circuit is a first self-test terminal of the readout circuit for a high-precision vibration sensor, to which a positive self-test voltage is input; the second input terminal of the on-chip self-test circuit is a second self-test terminal of the readout circuit for a high-precision vibration sensor, to which a negative self-test voltage is input; the first output terminal of the on-chip self-test circuit and the first input terminal of the low-noise charge amplifier are connected, and a connecting terminal is a positive input terminal of the readout circuit for a high-precision vibration sensor, which is connected to a positive output terminal of a vibration sensor; the second output terminal of the on-chip self-test circuit and the second input terminal of the low-noise charge amplifier are connected, and a connecting terminal is a negative input terminal of the readout circuit for a high-precision vibration sensor, which is connected to a negative output terminal of the vibration sensor; the first output terminal of the low-noise charge amplifier is connected to the first input terminal of the correlated double sampling circuit, the second output terminal of the low-noise charge amplifier is connected to the second input terminal of the correlated double sampling circuit, the first output terminal of the correlated double sampling circuit is connected to the first input terminal of the phase compensation circuit and the first input terminal of the PID feedback control circuit, the second output terminal of the correlated double sampling circuit is connected to the second input terminal of the phase compensation circuit and the second input terminal of the PID feedback control circuit, the first input terminal of the PID feedback control circuit is connected to the positive input terminal of the readout circuit for a high-precision vibration sensor, the second output terminal of the PID feedback control circuit is connected to the negative input terminal of the readout circuit for a high-precision vibration sensor, and the first output terminal and the second output terminal of the phase compensation circuit output a pair of differential signals to Sigma-Delta, which converts the pair of differential signals into digital signals and outputs the digital signals.

Compared with the prior art, the invention has the following advantages: the readout circuit for a high-precision vibration sensor is constructed from the on-chip self-test circuit, the low-noise charge amplifier, the correlated double sampling circuit, the PID feedback control circuit, the phase compensation circuit and Sigma-Delta; when a low-frequency sinusoidal self-test signal is input between a first self-test terminal $V_{test-n}$ and a second self-test terminal $V_{test-p}$, the low-frequency sinusoidal self-test signal is amplified by the low-noise charge amplifier to a scope capable of being recognized by Sigma-Delta, then low-frequency noise and offsets in the low-frequency sinusoidal self-test signal are filtered out by the correlated double sampling circuit, and then a self-test path and a working path of the vibration sensor are separated in the time domain by the PID feedback control circuit, so the output precision of the vibration sensor will not be affected by the self-test signal (the low-frequency sinusoidal self-test signal); the phase compensation circuit performs zero compensation and pole compensation on the signal to maintain the stability of the whole loop, and Sigma-Delta converts analog signals into high-precision digital signals. In this way, the readout circuit provided by the invention has a self-test function, can realize self-test of capacitive accelerometers, and can avoid an independent self-test module which occupies a large area of the capacitive accelerometers; the self-test signal will not leak or be coupled to the output terminal of the capacitive accelerometers together with charges of the vibration sensor and will not compromise the output precision of the capacitive accelerometer, so the output precision of the capacitive accelerometer is high; and a high-order high-pass filter does not need to be cascaded to the output terminal of the capacitive accelerometers, so the use cost is not increased.

DETAILED DESCRIPTION OF THE INVENTION

The invention will be described in further detail below in conjunction with the accompanying drawings.

Figure 1:
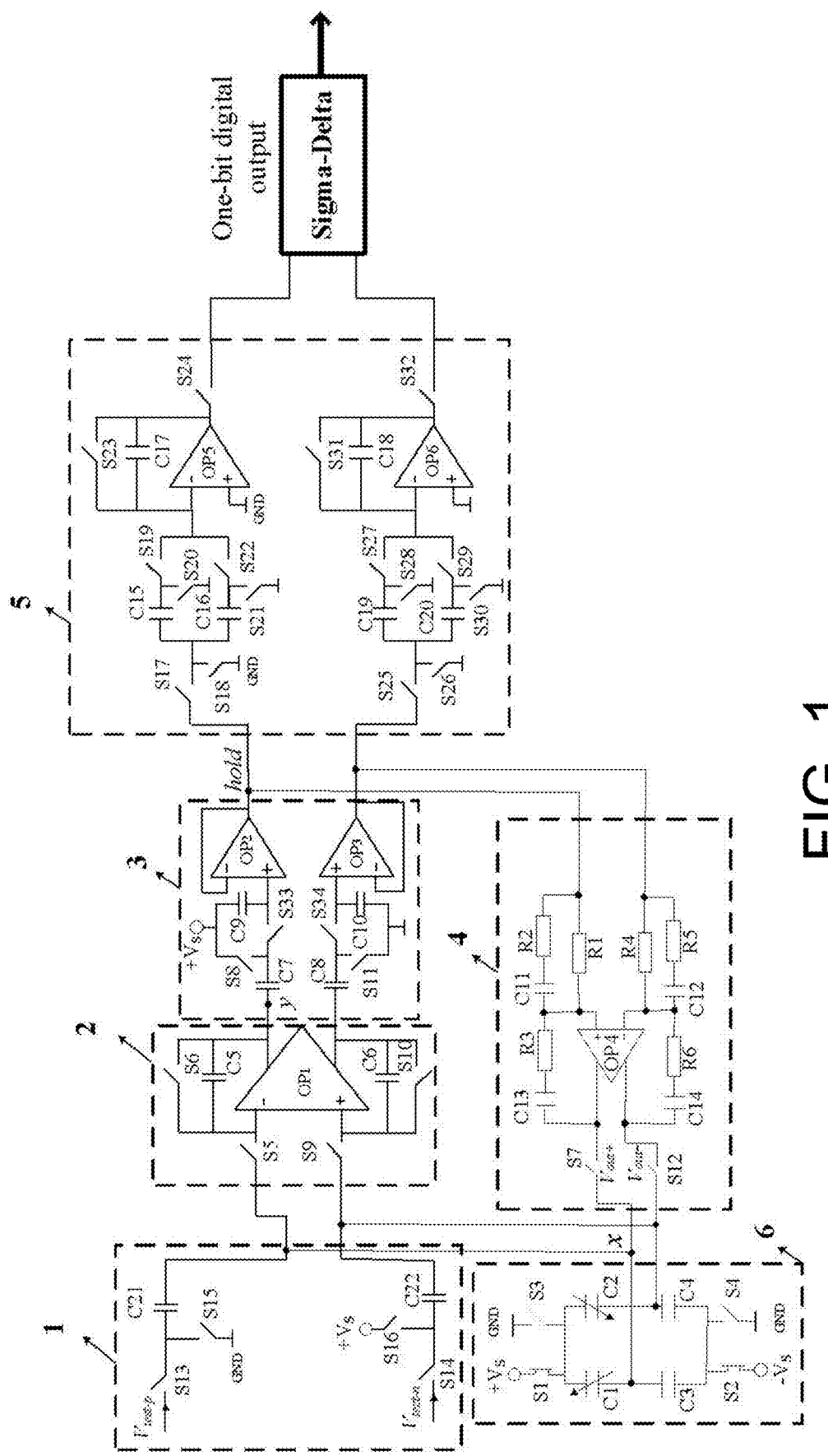
FIG. 1 is a circuit diagram of a readout circuit for a high-precision vibration sensor according to the invention.

Embodiment: As shown in FIG. 1, a readout circuit for a high-precision vibration sensor comprises an on-chip self-test circuit 1, a low-noise charge amplifier 2, a correlated double sampling circuit 3, a proportional integral differential (PID) feedback control circuit 4, a phase compensation circuit 5 and Sigma-Delta; the on-chip self-test circuit 1 comprises a thirteenth switch S13, a fourteenth switch S14, a fifteenth switch S15, a sixteenth switch S16, a twenty-first capacitor C21 and a twenty-second capacitor C22, wherein one terminal of the thirteenth switch S13 is a first input terminal of the on-chip self-test circuit 1, the other terminal of the thirteenth switch S13, one terminal of the fifteenth switch S15 and one terminal of the twenty-first capacitor C21 are connected, the other terminal of the fifteenth switch S15 is grounded (GND), the other terminal of the twenty-first capacitor C21 is a first output terminal of the on-chip self-test circuit 1, one terminal of the fourteenth switch S14 is a second input terminal of the on-chip self-test circuit 1, the other terminal of the fourteenth switch S14, one terminal of the sixteenth switch S16 and one terminal of the twenty-second capacitor C22 are connected, the other terminal of the sixteenth switch S16 is connected to a positive pole +Vs of a power supply, and the other terminal of the twenty-second capacitor C22 is a second output terminal of the on-chip self-test circuit 1;

The low-noise charge amplifier 2 comprises a fifth capacitor C5, a sixth capacitor C6, a first operational amplifier OP1, a fifth switch S5, a sixth switch S6, a ninth switch S9 and a tenth switch S10, wherein the first operational amplifier OP1 has a positive input terminal, a negative input terminal, a positive output terminal and a negative output terminal, one terminal of the fifth switch S5 is a first input terminal of the low-noise charge amplifier 2, the other terminal of the fifth switch S5, one terminal of the sixth switch S6, one terminal of the fifth capacitor C5 and the negative input terminal of the first operational amplifier OP1 are connected, the other terminal of the sixth switch S6, the other terminal of the fifth capacitor C5 and the positive output terminal of the first operational amplifier OP1 are connected and a connecting terminal is a first output terminal of the low-noise charge amplifier 2, one terminal of the ninth switch S9 is a second input terminal of the low-noise charge amplifier 2, the other terminal of the ninth switch S9, one terminal of the tenth switch S10, one terminal of the sixth capacitor C6 and the positive input terminal of the first operational amplifier OP1 are connected, and the other terminal of the tenth switch S10, the other terminal of the sixth capacitor C6 and the negative output terminal of the first operational amplifier OP1 are connected and a connecting terminal is a second output terminal of the low-noise charge amplifier 2; the correlated double sampling circuit 3 comprises a seventh capacitor C7, an eighth capacitor C8, a ninth capacitor C9, a tenth capacitor C10, a second operational amplifier OP2, a third operational amplifier OP3, an eighth switch S8, an eleventh switch S11, a thirty-third switch S33 and a thirty-forth switch S34, wherein the second operational amplifier OP2 and the third operational amplifier OP3 each have a positive input terminal, a negative input terminal and an output terminal, one terminal of the seventh capacitor C7 is a first input terminal of the correlated double sampling circuit 3, the other terminal of the seventh capacitor C7, one terminal of the eighth switch S8 and one terminal of the thirty-third switch S33 are connected, the other terminal of the thirty-third switch S33, one terminal of the ninth capacitor C9 and the positive input terminal of the second operational amplifier OP2 are connected, the other terminal of the eighth switch S8 and the other terminal of the ninth capacitor C9 are both connected to the positive pole +Vs of the power supply, the negative input terminal of the second operational amplifier OP2 and the output terminal of the second operational amplifier OP2 are connected and a connecting terminal is a first output terminal of the correlated double sampling circuit 3, one terminal of the eighth capacitor C8 is a second input terminal of the correlated double sampling circuit 3, the other terminal of the eighth capacitor C8, one terminal of the eleventh switch S11 and one terminal of the thirty-fourth switch S34 are connected, the other terminal of the thirty-fourth switch S34, one terminal of the tenth capacitor C10 and the positive input terminal of the third operational amplifier OP3 are connected, the other terminal of the eleventh switch S11 and the other terminal of the tenth capacitor C10 are both connected to the positive pole +Vs of the power supply, and the negative input terminal of the third operational amplifier OP3 and the output terminal of the third operational amplifier OP3 are connected and a connecting terminal is a second output terminal of the correlated double sampling circuit 3; the PID feedback control circuit 4 comprises a seventh switch S7, a twelfth switch S12, a first resistor R1, a second resistor R2, a third resistor R3, a fourth resistor R4, a fifth resistor R5, a sixth resistor R6, an eleventh capacitor C11, a twelfth capacitor C12, a thirteenth capacitor C13, a fourteenth capacitor C14 and a fourth operational amplifier OP4, wherein the fourth operational amplifier OP4 has a positive input terminal, a negative input terminal, a positive output terminal and a negative output terminal, one terminal of the seventh switch S7 is a first output terminal of the PID feedback control circuit 4, the other terminal of the seventh switch S7, one terminal of the thirteenth capacitor C13 and the positive output terminal of the fourth operational amplifier 4 are connected, the other terminal of the thirteenth capacitor C13 is connected to one terminal of the third resistor R3, the other terminal of the third resistor R3, one terminal of the eleventh capacitor C11, one terminal of the first resistor R1 and the positive input terminal of the fourth operational amplifier OP4 are connected, the other terminal of the eleventh capacitor C11 is connected to one terminal of the second resistor R2, the other terminal of the second resistor R2 and the other terminal of the first resistor R1 are connected and a connecting terminal is a first input terminal of the PID feedback control circuit 4, one terminal of the twelfth switch S12 is a second output terminal of the PID feedback control circuit 4, the other terminal of the twelfth switch S12, one terminal of the fourteenth capacitor C14 and the negative output terminal of the fourth operational amplifier OP4 are connected, the other terminal of the fourteenth capacitor C14 is connected to one terminal of the sixth resistor R6, the other terminal of the sixth resistor R6, one terminal of the twelfth capacitor C12, one terminal of the fourth resistor R4 and the negative input terminal of the fourth operational amplifier OP4 are connected, the other terminal of the twelfth capacitor C12 is connected to one terminal of the fifth resistor R5, the other terminal of the fifth resistor R5 and the other terminal of the fourth resistor R4 are connected and a connecting terminal is a second input terminal of the PID feedback control circuit 4; the phase compensation circuit 5 comprises a seventeenth switch S17, an eighteenth switch S18, a nineteenth switch S19, a twentieth switch S20, a twenty-first switch S21, a twenty-second switch S22, a twenty-third switch S23, a twenty-fourth switch S24, a twenty-fifth switch S25, a twenty-sixth switch S26, a twenty-seventh switch S27, a twenty-eighth switch S28, a twenty-ninth switch S29, a thirtieth switch S30, a thirty-first switch S31, a thirty-second switch S32, a fifteenth capacitor C15, a sixteenth capacitor C16, a seventeenth capacitor C17, an eighteenth capacitor C18, a nineteenth capacitor C19, a twentieth capacitor C20, a fifth operational amplifier OP5 and a sixth operational amplifier OP6, wherein the fifth operational amplifier OP5 and the sixth operational amplifier OP6 each have a positive input terminal, a negative input terminal and an output terminal, one terminal of the seventeenth switch S17 is a first input terminal of the phase compensation circuit 5, the other terminal of the seventeenth switch S17, one terminal of the eighteenth switch S18, one terminal of the fifteenth capacitor C15 and one terminal of the sixteenth capacitor C16 are connected, the other terminal of the eighteenth switch S18 is grounded, the other terminal of the fifteenth capacitor C15, one terminal of the nineteenth switch S19 and one terminal of the twentieth switch S20 are connected, the other terminal of the twentieth switch S20 is grounded, the other terminal of the sixteenth capacitor C16, one terminal of the twenty-first switch S21 and one terminal of the twenty-second switch S22 are connected, the other terminal of the twenty-first switch S21 is grounded, the other terminal of the nineteenth switch S19, the other terminal of the twenty-second switch S22, one terminal of the twenty-third switch S23, one terminal of the seventeenth capacitor C17 and the negative input terminal of the fifth operational amplifier OP5 are connected, the positive input terminal of the fifth operational amplifier OP5 is grounded, the other terminal of the twenty-third switch S23, the other terminal of the seventeenth capacitor C17, one terminal of the twenty-fourth switch S24 and the output terminal of the fifth operational amplifier OP5 are connected, the other terminal of the twenty-fourth switch S24 is a first output terminal of the phase compensation circuit 5, one terminal of the twenty-fifth switch S25 is a second input terminal of the phase compensation circuit 5, the other terminal of the twenty-fifth switch S25, one terminal of the twenty-sixth switch S26, one terminal of the nineteenth capacitor C19 and one terminal of the twentieth capacitor C20 are connected, the other terminal of the twenty-sixth switch S26 is grounded, the other terminal of the nineteenth capacitor C19, one terminal of the twenty-seventh switch S27 and one terminal of the twenty-eighth switch S28 are connected, the other terminal of the twenty-eighth switch S28 is grounded, the other terminal of the twentieth capacitor C20, one terminal of the thirtieth switch S20 and one terminal of the twenty-ninth switch S29 are connected, the other terminal of the thirtieth switch S30 is grounded, the other terminal of the twenty-seventh switch S27, the other end of the twenty-ninth switch S29, one terminal of the thirty-first switch S31, one terminal of the eighteenth capacitor C18 and the negative input terminal of the sixth operational amplifier OP6 are connected, the positive input terminal of the sixth operational amplifier OP6 is grounded, the other terminal of the thirty-first switch S31, the other terminal of the eighteenth capacitor C18, one terminal of the thirty-second switch S32 and the output terminal of the sixth operational amplifier OP6 are connected, and the other terminal of the thirty-second switch S32 is a second output terminal of the phase compensation circuit 5; the first input terminal of the on-chip self-test circuit 1 is a first self-test terminal Vtest-p of the readout circuit for a high-precision vibration sensor, to which a positive self-test voltage is input; the second input terminal of the on-chip self-test circuit 1 is a second self-test terminal Vtest-n of the readout circuit for a high-precision vibration sensor, to which a negative self-test voltage is input; the first output terminal of the on-chip self-test circuit 1 and the first input terminal of the low-noise charge amplifier 2 are connected, and a connecting terminal is a positive input terminal of the readout circuit for a high-precision vibration sensor, which is connected to a positive output terminal of a vibration sensor; the second output terminal of the on-chip self-test circuit 1 and the second input terminal of the low-noise charge amplifier 2 are connected, and a connecting terminal is a negative input terminal of the readout circuit for a high-precision vibration sensor, which is connected to a negative output terminal of the vibration sensor; the first output terminal of the low-noise charge amplifier 2 is connected to the first input terminal of the correlated double sampling circuit 3, the second output terminal of the low-noise charge amplifier 2 is connected to the second input terminal of the correlated double sampling circuit 3, the first output terminal of the correlated double sampling circuit 3 is connected to the first input terminal of the phase compensation circuit 5 and the first input terminal of the PID feedback control circuit 4, the second output terminal of the correlated double sampling circuit 3 is connected to the second input terminal of the phase compensation circuit 5 and the second input terminal of the PID feedback control circuit 4, the first output terminal of the PID feedback control circuit 4 is connected to the positive input terminal of the readout circuit for a high-precision vibration sensor, the second output terminal of the PID feedback control circuit 4 is connected to the negative input terminal of the readout circuit for a high-precision vibration sensor, and the first output terminal and the second output terminal of the phase compensation circuit 5 output a pair of differential signals to Sigma-Delta, which converts the pair of differential signals into digital signals and outputs the digital signals.

In this embodiment, all the switches are analog switches.

According to the invention, the positive input terminal of the readout circuit for a high-precision vibration sensor is connected to a positive output terminal of a vibration sensor, and the negative input terminal of the readout circuit for a high-precision vibration sensor is connected to a negative output terminal of the vibration sensor, wherein an equivalent circuit 6 of the vibration sensor is shown in FIG. 1. The specific process of realizing self-test and data output of the positive input terminal of the readout circuit for a high-precision vibration sensor and the vibration sensor is as follows: a low-frequency sinusoidal self-test signal is input between the first self-test terminal $V_{test-n}$ and the second self-test terminal $V_{test-p}$, the low-frequency sinusoidal self-test signal is amplified by the low-noise charge amplifier to a scope capable of being recognized by Sigma-Delta, then low-frequency noise and offsets in the low-frequency sinusoidal self-test signal are filtered out by the correlated double sampling circuit, and then a self-test path and a working path of the vibration sensor are separated in the time domain by the PID feedback control circuit, so the output precision of the vibration sensor will not be affected by the self-test signal (the low-frequency sinusoidal self-test signal); the phase compensation circuit performs zero compensation and pole compensation on the signal to maintain the stability of the whole loop, and Sigma-Delta converts analog signals into high-precision digital signals.

Figure 2:
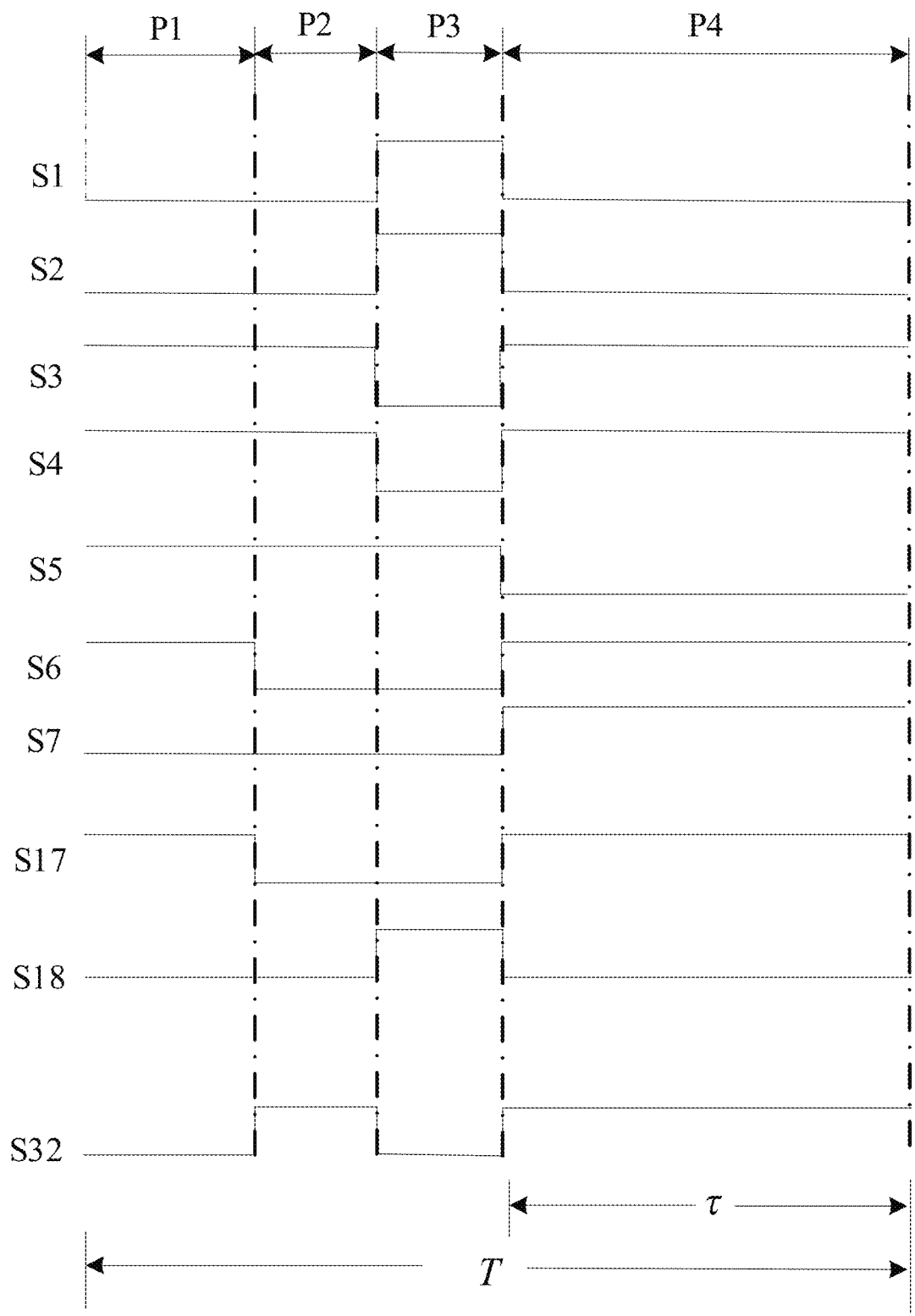
FIG. 2 illustrates the work sequence of the readout circuit for a high-precision vibration sensor according to the invention.

The whole work cycle T of the readout circuit for a high-precision vibration sensor comprises four time phases: a charge amplifier error pickup phase (P1), a charge amplifier preparation phase (P2), a charge amplifier sampling phase (P3) and an electrostatic closed-loop feedback phase (P4), and the work sequence of the analog switches in the readout circuit is shown in FIG. 2. The state of the analog switches is as follows: the first switch S1 and the second switch S2 are in the same phase and are turned on or off synchronously; the third switch S3 and the fourth switch S4 are in the same phase and are turned on or off synchronously; the fifth switch S5 and the ninth switch S9 are in the same phase and are turned on or off synchronously; the sixth switch S6 and the tenth switch S10 are in the same phase and are turned on or off synchronously; the seventh switch S7 and the twelfth switch S12 are in the same phase and are turned on or off synchronously; the eighth switch S8 and the eleventh switch S11 are in the same phase and are turn on or off synchronously, the thirteenth switch S13 and the fourteenth switch S14 are in the same phase and are turned on or off at the same time; the fifth switch S15 and the sixteenth switch S16 are in the same phase and are turned on or off at the same time; the thirty-third switch S33 and the thirty-fourth switch S34 are in the same phase and are turned on or off at the same time; the eighteenth switch S18, the twentieth switch S20, the twenty-second switch S22, the twenty-sixth switch S26, the twenty-eighth switch S28 and the twenty-ninth switch S29 are in the same phase and are turned on or off synchronously; the seventeenth switch S17, the nineteenth switch S19, the twenty-first switch S21, the twenty-fourth switch S24, the twenty-fifth switch S25, the twenty-seventh switch S27, the thirtieth switch S30 and the thirty-second switch S32 are in the same phase and are turned on or off synchronously; the twenty-third switch 23 and the thirty-first switch S31 are in the same phase and are turned on or off synchronously. It can be known, by analyzing FIG. 2, that the analog switches cyclically work in this sequence to complete a closed-loop operation process of a capacitive accelerometer.

In phase P1, the first switch S1, the second switch S2, the seventh switch S7, the eighteenth switch S18 and the thirty-second switch S32 are turned off, the third switch S3, the fourth switch S4, the fifth switch S5, the sixth switch S6 and the seventeenth S17 are turned on, the low-noise charge amplifier applies an offset voltage and a low-frequency noise voltage (which are collectively called an error voltage $V_n$) to node x, the voltage at node x is $V_x$, so the quantity of electric charges at node x is:

$$Q_X=(V_X-V_S)C_1+(V_X+V_S)C_2=(V_N-V_S)C_1+(V_N+V_S)C_2 \qquad (1)$$

In formula (1), $C_1$ denotes the capacitance of the first capacitor C1 (adjustable capacitor) in the equivalent circuit 6 of the vibration sensor, $V_S$ denotes the supply voltage of the positive pole of the power supply, and $C_2$ denotes the capacitance of the second capacitor C2 (adjustable capacitor) in the equivalent circuit 6 of the vibration sensor;

In phase P2, the first switch S1, the second switch S2, the sixth switch S6, the seventh switch S7, the seventeenth switch S17 and the eighteenth switch S18 are turned off, the third switch S3, the fourth switch S4, the fifth switch S5 and the thirty-second switch S32 are turned on, the low-noise charge amplifier is in a charge test preparation state; because all the switches in the readout circuit are analog switches, a small quantity of electric charges will be injected into the analog switches when the analog switches are turned on or off, and coupling will be caused when a clock signal used for controlling the analog switches to be turned on or off is input to the analog switches, which will compromise the signal precision of the analog switches, and this phenomenon is called clock feed-through. So, the analog switches have a quantity of undesired electric charges and a quantity of electric charges caused by clock feed-through, the quantity of undesired electric charges is $Q_{injection}$, and the quantity of electric charges caused by clock feed-through is $Q_{clock}$, so the quantity of electric charges at node x is:

$$Q_x = (V_n - V_S)C_1 + (V_n + V_S)C_2 + Q_{injection} + Q_{clock} \quad (2)$$

At this moment, the thirty-third switch S33 is turned off, the noise voltage output by the first output terminal of the low-noise charge amplifier is stored in the seventh capacitor C7, and the total quantity of electric charges at node y is:

$$Q_y = \left(V_n - \frac{Q_{injection} + Q_{clock}}{C_5}\right) \cdot C_7 \quad (3)$$

In formula (3), $C_5$ denotes the capacitance of the fifth capacitor C5, and $C_7$ denotes the capacitance of the seventh capacitor C7;

In phase P3, the third switch S3, the fourth switch S4, the sixth switch S6, the seventh switch S7, the seventeenth switch S17 and the thirty-second switch S32 are turned off, the first switch S1, the second switch S2, the fifth switch S5 and the eighteenth switch S18 are turned on, the first capacitor C1 and the second capacitor C2 are grounded, the quantity of electric charges at node x remains unchanged, and at this moment, the total quantity of electric charges at node x meets the following equation:

$$Q_x = V_n(C_1 + C_2) + (V_n - V_y)C_5 = (V_n - V_S)C_1 + (V_n + V_S)C_2 + Q_{injection} + Q_{clock} \quad (4)$$

According to formula (1), the voltage at node x is represented by $V_X$, so the voltage $V_{out}$ between the first output terminal and the second output terminal of the low-noise charge amplifier is:

$$V_{out} = V_y = \frac{V_S(C_1 - C_2)}{C_5} + V_n - \frac{Q_{injection} + Q_{clock}}{C_5} \quad (5)$$

In this work phase, the thirty-third switch S33 is turned off, and the quantity of electric charges on the seventh capacitor C7 remains unchanged, and the relation is:

$$(V_y - V_{hold}) \cdot C_7 = \left(V_n - \frac{Q_{injection} + Q_{clock}}{C_5}\right) \cdot C_7 \quad (6)$$

In formula (6), $V_{hold}$ is the voltage at node hold;
The voltage at node y is:

$$V_y = \frac{V_S(C_1 - C_2)}{C_5} \quad (7)$$

At this moment, the low-frequency 1/f noise of the low-noise charge amplifier, charges injected into the sixth switch S6, and error charges caused by clock feed-through have been eliminated by the voltage $V_y$ output by the 1/f correlated double sampling circuit, and then, $V_y$ is held in the ninth capacitor C9;

In clock phase P4, the first switch S1, the second switch S2, the fifth switch S5 and the eighteenth switch S18 are turned off, the third switch S3, the fourth switch S4, the sixth switch S6, the seventh switch S7, the seventeenth switch S17 and the thirty-second switch S32 are turned on, the voltage at node hold is denoted by $V_{hold}$, and $V_{hold}$ is fed back to node x by the PID feedback control circuit, such that electrostatic feedback is realized; at this moment, the low-noise charge amplifier has been completely isolated from the PID feedback control circuit by the fifth switch S5 and the eighth switch S8, coupling between drive signals and test signals is avoided, a high-order high-pass filter does not need to be cascaded to the output terminal, and demodulation output errors caused by parameter changes of the filter are avoided. In the phase compensation circuit, when the twenty-third switch S23 is turned on, the seventeenth capacitor C17 and the eighteenth capacitor C18 are reset; when the eighteenth switch S18 is turned on, electric charges on the sixteenth capacitor C16 and the twentieth capacitor C20 are integrated, and electric charges on the fifteenth capacitor C15 and electric charges on the nineteenth capacitor C19 are released; when the seventeenth switch S17 is turned on, the fifteenth capacitor C15 and the nineteenth capacitor C19 sample an input signal, and the sum of the input signal sampled by the fifteenth capacitor C15 and the nineteenth capacitor C19 and the signal previously sampled by the seventeenth capacitor C17 and the eighteenth capacitor C18, such that signal output is realized. Then, this process is started again from the clock phase P1 and is repeated.

Figure 3:
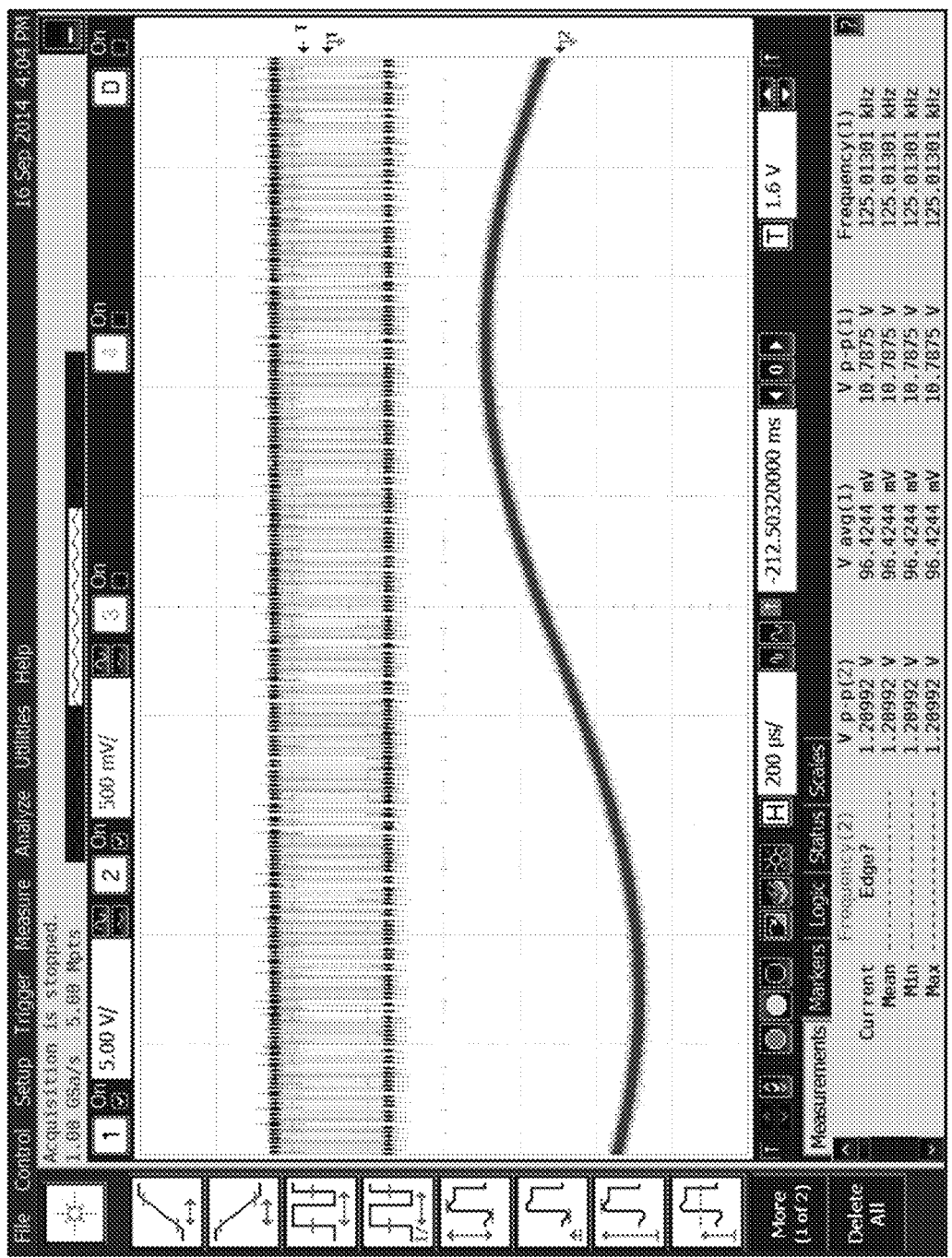
FIG. 3 is a time-domain response oscillogram of an output terminal when a 600 mV and 400 Hz low-frequency sinusoidal stimulus signal is input to a capacitive accelerometer using the readout circuit for a high-precision vibration sensor according to the invention.

According to a capacitive accelerometer adopting the readout circuit for a high-precision vibration sensor, a low-frequency sinusoidal stimulus signal is input between the first self-test terminal $V_{test-n}$ and the second self-test terminal $V_{test-p}$, the output bit stream of the capacitive accelerometer is acquired by an oscilloscope to determine whether the capacitive accelerometer works normally, and when the amplitude of the input low-frequency sinusoidal stimulus signal is 600 mV and the frequency is 400 Hz, the time-domain response oscillogram of the capacitive accelerometer is shown in FIG. 3. As shown in FIG. 3, the output bit stream is displayed by the upper portion of the screen of the oscilloscope, the self-test input signal is shown on the lower portion of the screen of the oscilloscope, and it can be known according to the output oscillogram of the capacitive accelerometer, the self-test function is correct.

What is claimed is:

1. A readout circuit for a high-precision vibration sensor, wherein the readout circuit comprises an on-chip self-test circuit, a low-noise charge amplifier, a correlated double sampling circuit, a proportional integral differential (PID) feedback control circuit, a phase compensation circuit and Sigma-Delta;

the on-chip self-test circuit comprises a thirteenth switch, a fourteenth switch, a fifteenth switch, a sixteenth switch, a twenty-first capacitor and a twenty-second capacitor, wherein one terminal of the thirteenth switch is a first input terminal of the on-chip self-test circuit, the other terminal of the thirteenth switch, one terminal of the fifteenth switch and one terminal of the twenty-first capacitor are connected, the other terminal of the fifteenth switch is grounded, the other terminal of the twenty-first capacitor is a first output terminal of the on-chip self-test circuit, one terminal of the fourteenth switch is a second input terminal of the on-chip self-test circuit, the other terminal of the fourteenth switch, one terminal of the sixteenth switch and one terminal of the twenty-second capacitor are connected, the other terminal of the sixteenth switch is connected to a positive pole of a power supply, and the other terminal of the twenty-second capacitor is a second output terminal of the on-chip self-test circuit;

the low-noise charge amplifier comprises a fifth capacitor, a sixth capacitor, a first operational amplifier, a fifth switch, a sixth switch, a ninth switch and a tenth switch, wherein the first operational amplifier has a positive input terminal, a negative input terminal, a positive output terminal and a negative output terminal, one terminal of the fifth switch is a first input terminal of the low-noise charge amplifier, the other terminal of the fifth switch, one terminal of the sixth switch, one terminal of the fifth capacitor and the negative input terminal of the first operational amplifier are connected, the other terminal of the sixth switch, the other terminal of the fifth capacitor and the positive output terminal of the first operational amplifier are connected and a connecting terminal is a first output terminal of the low-noise charge amplifier, one terminal of the ninth switch is a second input terminal of the low-noise charge amplifier, the other terminal of the ninth switch, one terminal of the tenth switch, one terminal of the sixth capacitor and the positive input terminal of the first operational amplifier are connected, and the other terminal of the tenth switch, the other terminal of the sixth capacitor and the negative output terminal of the first operational amplifier are connected and a connecting terminal is a second output terminal of the low-noise charge amplifier;

the correlated double sampling circuit comprises a seventh capacitor, an eighth capacitor, a ninth capacitor, a tenth capacitor, a second operational amplifier, a third operational amplifier, an eighth switch, an eleventh switch, a thirty-third switch and a thirty-forth switch, wherein the second operational amplifier and the third operational amplifier each have a positive input terminal, a negative input terminal and an output terminal, one terminal of the seventh capacitor is a first input terminal of the correlated double sampling circuit, the other terminal of the seventh capacitor, one terminal of the eighth switch and one terminal of the thirty-third switch are connected, the other terminal of the thirty-third switch, one terminal of the ninth capacitor and the positive input terminal of the second operational amplifier are connected, the other terminal of the eighth switch and the other terminal of the ninth capacitor are both connected to the positive pole of the power supply, the negative input terminal of the second operational amplifier and the output terminal of the second operational amplifier are connected and a connecting terminal is a first output terminal of the correlated double sampling circuit, one terminal of the eighth capacitor is a second input terminal of the correlated double sampling circuit, the other terminal of the eighth capacitor, one terminal of the eleventh switch and one terminal of the thirty-fourth switch are connected, the other terminal of the thirty-fourth switch, one terminal of the tenth capacitor and the positive input terminal of the second operational amplifier are connected, the other terminal of the eleventh switch and the other terminal of the tenth capacitor are both connected to the positive pole of the power supply, and the negative input terminal of the third operational amplifier and the output terminal of the third operational amplifier are connected and a connecting terminal is a second output terminal of the correlated double sampling circuit;

the PID feedback control circuit comprises a seventh switch, a twelfth switch, a first resistor, a second resistor, a third resistor, a fourth resistor, a fifth resistor, a sixth resistor, an eleventh capacitor, a twelfth capacitor, a thirteenth capacitor, a fourteenth capacitor and a fourth operational amplifier, wherein the fourth operational amplifier has a positive input terminal, a negative input terminal, a positive output terminal and a negative output terminal, one terminal of the seventh switch is a first output terminal of the PID feedback control circuit, the other terminal of the seventh switch, one terminal of the thirteenth capacitor and the positive output terminal of the fourth operational amplifier are connected, the other terminal of the thirteenth capacitor is connected to one terminal of the third resistor, the other terminal of the third resistor, one terminal of the eleventh capacitor, one terminal of the first resistor and the positive input terminal of the fourth operational amplifier are connected, the other terminal of the eleventh capacitor is connected to one terminal of the second resistor, the other terminal of the second resistor and the other terminal of the first resistor are connected and a connecting terminal is a first input terminal of the PID feedback control circuit, one terminal of the twelfth switch is a second output terminal of the PID feedback control circuit, the other terminal of the twelfth switch, one terminal of the fourteenth capacitor and the negative output terminal of the fourth operational amplifier are connected, the other terminal of the fourteenth capacitor is connected to one terminal of the sixth resistor, the other terminal of the sixth resistor, one terminal of the twelfth capacitor, one terminal of the fourth resistor and the negative input terminal of the fourth operational amplifier are connected, the other terminal of the twelfth capacitor is connected to one terminal of the fifth resistor, the other terminal of the fifth resistor and the other terminal of the fourth resistor are connected and a connecting terminal is a second input terminal of the PID feedback control circuit;

the phase compensation circuit comprises a seventeenth switch, an eighteenth switch, a nineteenth switch, a twentieth switch, a twenty-first switch, a twenty-second switch, a twenty-third switch, a twenty-fourth switch, a twenty-fifth switch, a twenty-sixth switch, a twenty-seventh switch, a twenty-eighth switch, a twenty-ninth switch, a thirtieth switch, a thirty-first switch, a thirty-second switch, a fifteenth capacitor, a sixteenth capacitor, a seventeenth capacitor, an eighteenth capacitor, a nineteenth capacitor, a twentieth capacitor, a fifth operational amplifier and a sixth operational amplifier, wherein the fifth operational amplifier and the sixth operational amplifier each have a positive input terminal, a negative input terminal and an output terminal, one terminal of the seventeenth switch is a first input terminal of the phase compensation circuit, the other terminal of the seventeenth switch, one terminal of the eighteenth switch, one terminal of the fifteenth capacitor and one terminal of the sixteenth capacitor are connected, the other terminal of the eighteenth switch is grounded, the other terminal of the fifteenth capacitor, one terminal of the nineteenth switch and one terminal of the twentieth switch are connected, the other terminal of the twentieth switch is grounded, the other terminal of the sixteenth capacitor, one terminal of the twenty-first switch and one terminal of the twenty-second switch are connected, the other terminal of the twenty-first switch is grounded, the other terminal of the nineteenth switch, the other terminal of the twenty-second switch, one terminal of the twenty-third switch, one terminal of the seventeenth capacitor and the negative input terminal of the fifth operational amplifier are connected, the positive input terminal of the fifth operational amplifier is grounded, the other terminal of the twenty-third switch, the other terminal of the seventeenth capacitor, one terminal of the twenty-fourth switch and the output terminal of the fifth operational amplifier are connected, the other terminal of the twenty-fourth switch is a first output terminal of the phase compensation circuit, one terminal of the twenty-fifth switch is a second input terminal of the phase compensation circuit, the other terminal of the twenty-fifth switch, one terminal of the twenty-sixth switch, one terminal of the nineteenth capacitor and one terminal of the twentieth capacitor are connected, the other terminal of the twenty-sixth switch is grounded, the other terminal of the nineteenth capacitor, one terminal of the twenty-seventh switch and one terminal of the twenty-eighth switch are connected, the other terminal of the twenty-eighth switch is grounded, the other terminal of the twentieth capacitor, one terminal of the thirtieth switch and one terminal of the twenty-ninth switch are connected, the other terminal of the thirtieth switch is grounded, the other terminal of the twenty-seventh switch, the other end of the twenty-ninth switch, one terminal of the thirty-first switch, one terminal of the eighteenth capacitor and the negative input terminal of the sixth operational amplifier are connected, the positive input terminal of the sixth operational amplifier is grounded, the other terminal of the thirty-first switch, the other terminal of the eighteenth capacitor, one terminal of the thirty-second switch and the output terminal of the sixth operational amplifier are connected, and the other terminal of the thirty-second switch is a second output terminal of the phase compensation circuit;

the first input terminal of the on-chip self-test circuit is a first self-test terminal of the readout circuit for a high-precision vibration sensor, to which a positive self-test voltage is input; the second input terminal of the on-chip self-test circuit is a second self-test terminal of the readout circuit for a high-precision vibration sensor, to which a negative self-test voltage is input; the first output terminal of the on-chip self-test circuit and the first input terminal of the low-noise charge amplifier are connected, and a connecting terminal is a positive input terminal of the readout circuit for a high-precision vibration sensor, which is connected to a positive output terminal of a vibration sensor; the second output terminal of the on-chip self-test circuit and the second input terminal of the low-noise charge amplifier are connected, and a connecting terminal is a negative input terminal of the readout circuit for a high-precision vibration sensor, which is connected to a negative output terminal of the vibration sensor; the first output terminal of the low-noise charge amplifier is connected to the first input terminal of the correlated double sampling circuit, the second output terminal of the low-noise charge amplifier is connected to the second input terminal of the correlated double sampling circuit, the first output terminal of the correlated double sampling circuit is connected to the first input terminal of the phase compensation circuit and the first input terminal of the PID feedback control circuit, the second output terminal of the correlated double sampling circuit is connected to the second input terminal of the phase compensation circuit and the second input terminal of the PID feedback control circuit, the first input terminal of the PID feedback control circuit is connected to the positive input terminal of the readout circuit for a high-precision vibration sensor, the second output terminal of the PID feedback control circuit is connected to the negative input terminal of the readout circuit for a high-precision vibration sensor, and the first output terminal and the second output terminal of the phase compensation circuit output a pair of differential signals to Sigma-Delta, which converts the pair of differential signals into digital signals and outputs the digital signals.

\* \* \* \* \*